United States Patent
Chang et al.

(10) Patent No.: US 10,050,148 B2
(45) Date of Patent: *Aug. 14, 2018

(54) SEMICONDUCTOR DEVICE AND METHOD OF FORMING THE SAME

(71) Applicant: Taiwan Semiconductor Manufacturing Company, Ltd., Hsinchu (TW)

(72) Inventors: Chia-Ming Chang, Hsinchu (TW); Chi-Wen Liu, Hsinchu (TW); Hsin-Chieh Huang, Hsinchu (TW); Cheng-Chien Li, Jhubei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/589,777

(22) Filed: May 8, 2017

(65) Prior Publication Data

US 2017/0243976 A1    Aug. 24, 2017

Related U.S. Application Data

(63) Continuation of application No. 15/154,982, filed on May 14, 2016, now Pat. No. 9,647,122.

(60) Provisional application No. 62/218,933, filed on Sep. 15, 2015.

(51) Int. Cl.
*H01L 29/78* (2006.01)
*H01L 29/66* (2006.01)
*H01L 21/36* (2006.01)
*H01L 21/265* (2006.01)
*H01L 29/08* (2006.01)

(52) U.S. Cl.
CPC ...... *H01L 29/7848* (2013.01); *H01L 29/0847* (2013.01); *H01L 29/66636* (2013.01); *H01L 29/66795* (2013.01); *H01L 29/785* (2013.01)

(58) Field of Classification Search
CPC ............. H01L 29/7851; H01L 29/7848; H01L 29/401; H01L 29/4916; H01L 29/66795; H01L 29/0649
USPC .......... 257/401, 344, 618, 190, 77, E29.255, 257/E21.409, E21.421, E21.431; 438/283, 300, 301

See application file for complete search history.

(56) References Cited

U.S. PATENT DOCUMENTS

| | | | |
|---|---|---|---|
| 6,943,116 B2 | 9/2005 | Alsmeier et al. | |
| 7,312,128 B2 | 12/2007 | Kim et al. | |
| 7,667,271 B2 | 2/2010 | Yu et al. | |

(Continued)

FOREIGN PATENT DOCUMENTS

| | | |
|---|---|---|
| KR | 100938312 B1 | 1/2010 |
| KR | 1020130092346 A | 8/2013 |
| KR | 1020140111575 A | 9/2014 |

*Primary Examiner* — Dao H Nguyen
(74) *Attorney, Agent, or Firm* — Slater Matsil, LLP

(57) ABSTRACT

A semiconductor device includes a substrate, at least one semiconductor fin, and at least one epitaxy structure. The semiconductor fin is present on the substrate. The semiconductor fin has at least one recess thereon. The epitaxy structure is present in the recess of the semiconductor fin. A topmost location of the epitaxy structure has an n-type impurity concentration lower than an n-type impurity concentration of a location of the epitaxy structure below the topmost location.

20 Claims, 12 Drawing Sheets

(56) References Cited

U.S. PATENT DOCUMENTS

| | | | |
|---|---|---|---|
| 8,053,344 B1 * | 11/2011 | Fung | H01L 21/2257 |
| | | | 257/E21.135 |
| 8,362,575 B2 | 1/2013 | Kwok et al. | |
| 8,367,498 B2 | 2/2013 | Chang et al. | |
| 8,440,517 B2 | 5/2013 | Lin et al. | |
| 8,497,528 B2 | 7/2013 | Lee et al. | |
| 8,610,240 B2 | 12/2013 | Lee et al. | |
| 8,680,576 B2 | 3/2014 | Ching et al. | |
| 8,723,272 B2 | 5/2014 | Liu et al. | |
| 8,729,627 B2 | 5/2014 | Cheng et al. | |
| 8,729,634 B2 | 5/2014 | Shen et al. | |
| 8,785,285 B2 | 7/2014 | Tsai et al. | |
| 8,796,759 B2 | 8/2014 | Perng et al. | |
| 8,809,139 B2 | 8/2014 | Huang et al. | |
| 8,809,170 B2 * | 8/2014 | Bauer | H01L 21/02532 |
| | | | 438/494 |
| 8,828,823 B2 | 9/2014 | Liu et al. | |
| 8,836,016 B2 | 9/2014 | Wu et al. | |
| 8,841,701 B2 | 9/2014 | Lin et al. | |
| 8,847,293 B2 | 9/2014 | Lee et al. | |
| 8,853,025 B2 | 10/2014 | Zhang et al. | |
| 9,142,642 B2 | 9/2015 | Chen et al. | |
| 9,647,122 B2 * | 5/2017 | Chang | H01L 29/7848 |
| 2011/0068407 A1 | 3/2011 | Yeh et al. | |
| 2013/0011983 A1 | 1/2013 | Tsai et al. | |
| 2014/0084369 A1 * | 3/2014 | Murthy | H01L 21/02057 |
| | | | 257/344 |
| 2014/0113424 A1 * | 4/2014 | Lin | H01L 21/02381 |
| | | | 438/300 |
| 2014/0252412 A1 | 9/2014 | Tsai et al. | |
| 2014/0252489 A1 | 9/2014 | Yu et al. | |
| 2016/0013316 A1 * | 1/2016 | Kuang | H01L 21/0243 |
| | | | 257/190 |
| 2016/0027918 A1 | 1/2016 | Kim et al. | |
| 2016/0211371 A1 * | 7/2016 | Tsai | H01L 29/7848 |
| 2016/0254351 A1 | 9/2016 | Tsai | |

* cited by examiner

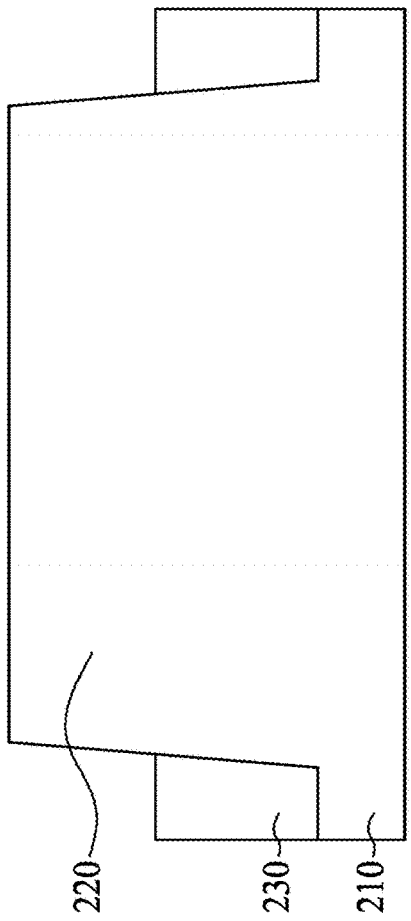
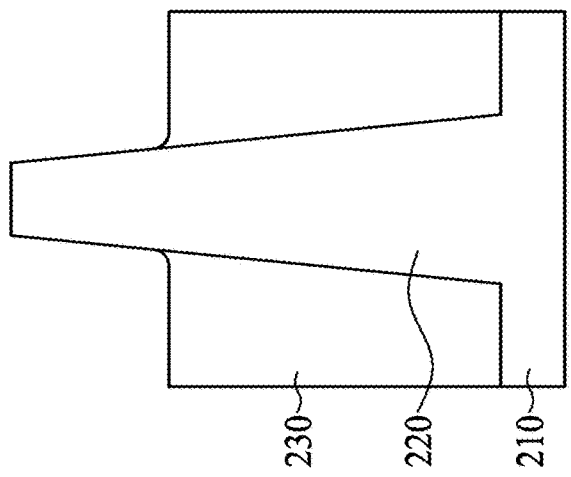
Fig. 7B
Fig. 7A

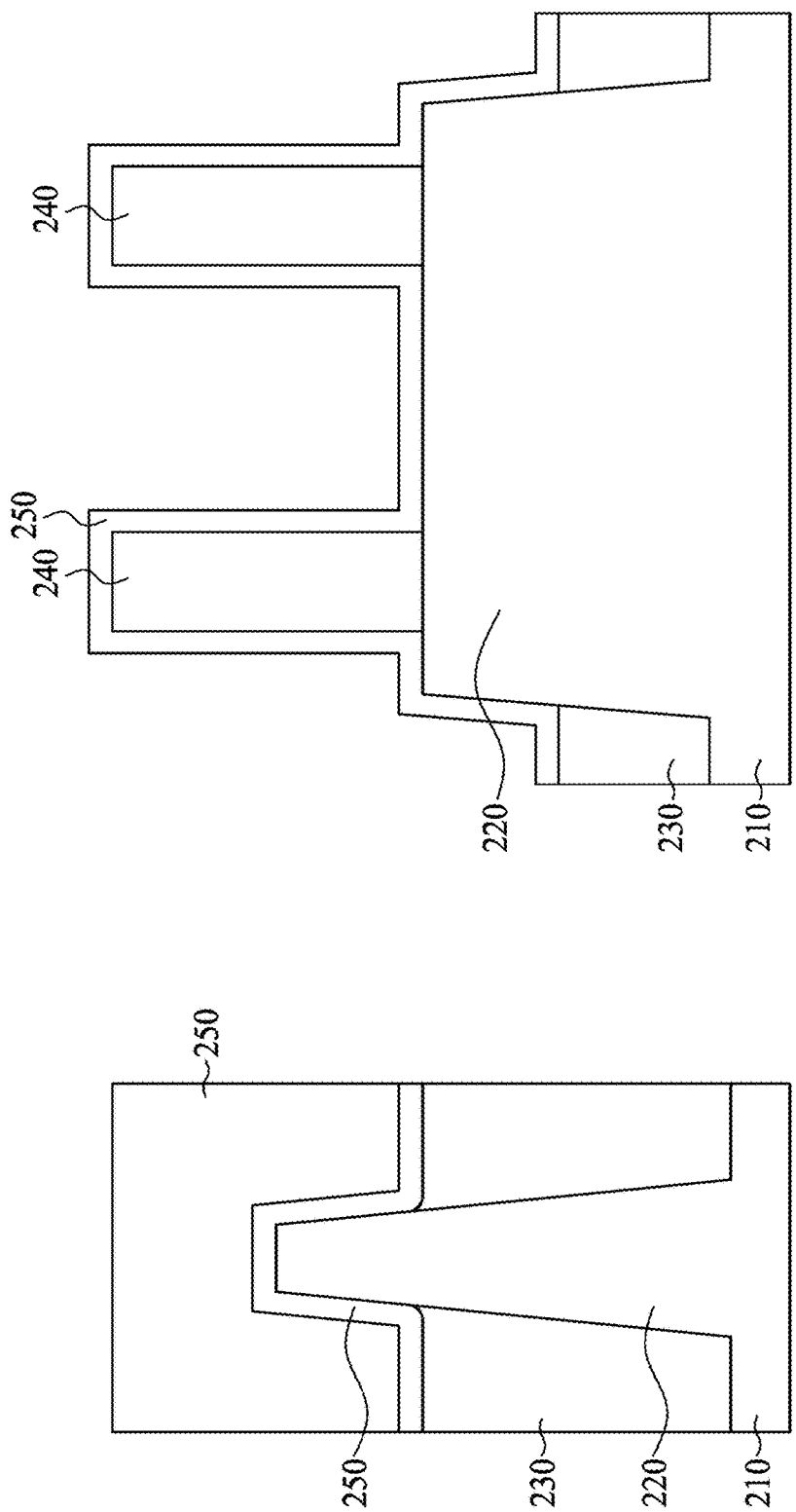

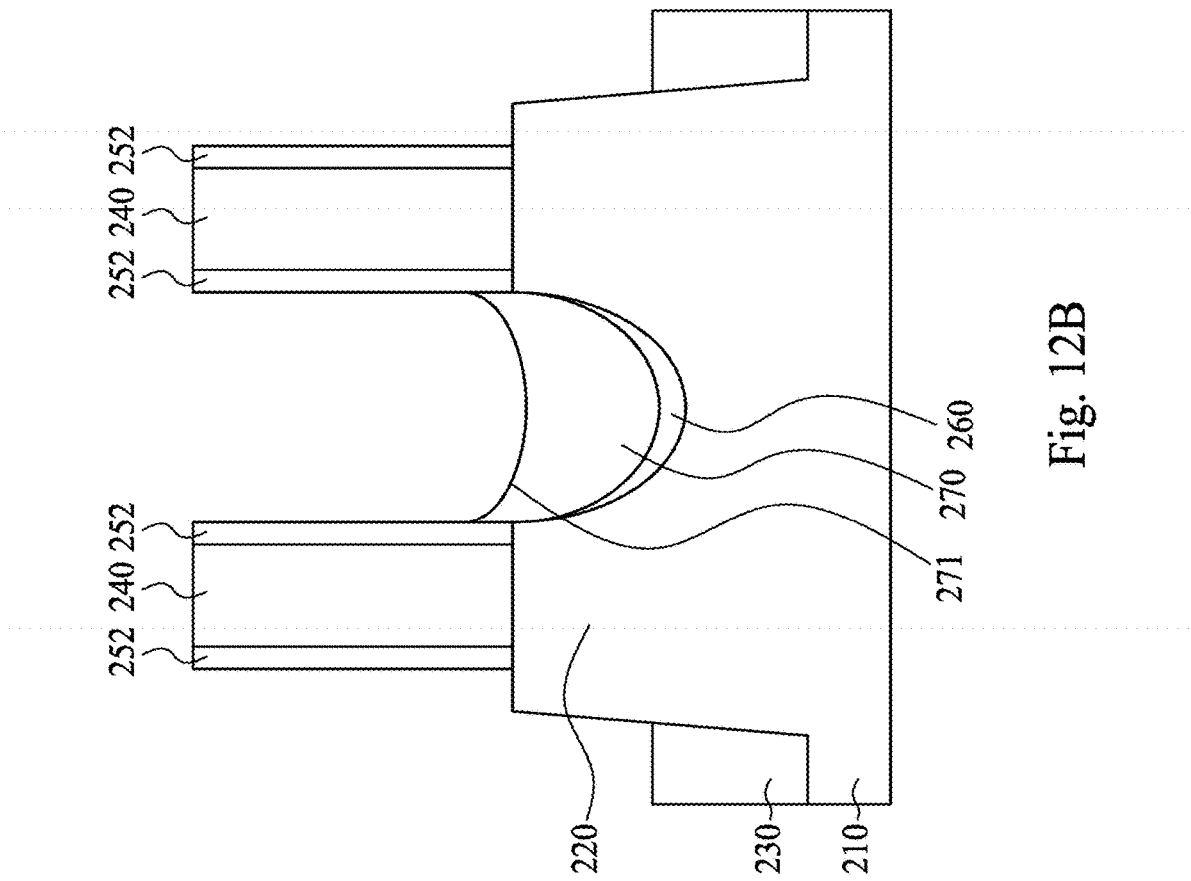
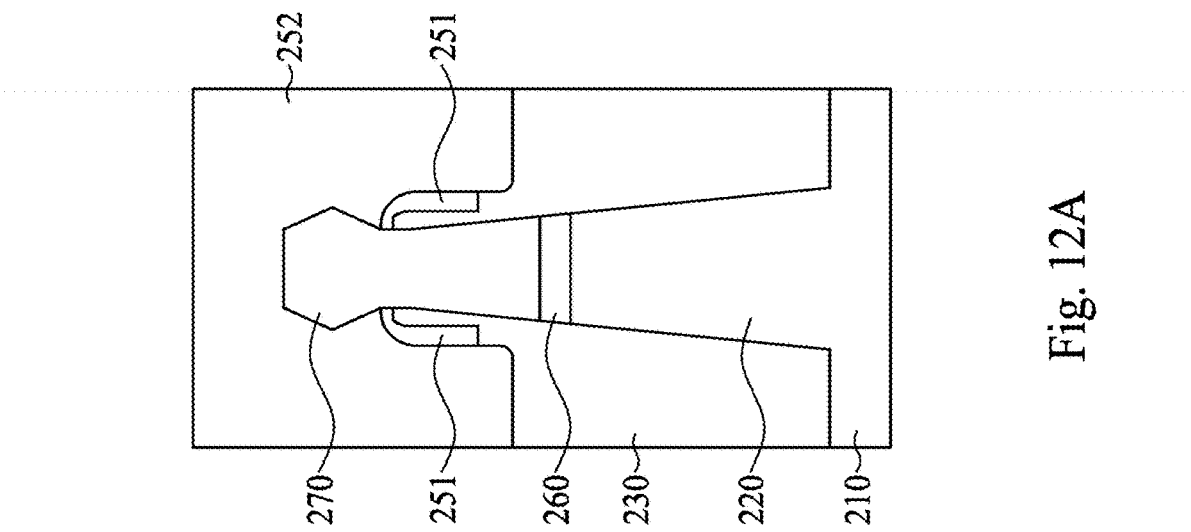
Fig. 12B
Fig. 12A

SEMICONDUCTOR DEVICE AND METHOD OF FORMING THE SAME

PRIORITY CLAIM AND CROSS-REFERENCE

This application is a continuation of U.S. patent application Ser. No. 15/154,982, filed on May 14, 2016, and entitled "Semiconductor Device and Method of Forming the Same" which claims priority to U.S. Provisional Application No. 62/218,933, filed Sep. 15, 2015, which applications are herein incorporated by reference.

BACKGROUND

In the race to improve transistor performance as well as reduce the size of transistors, transistors have been developed such that the channel and source/drain regions are located in a fin formed from the bulk substrate. Such non-planar devices can be referred to as multiple-gate finFETs. A multiple-gate finFET may have a gate electrode that straddles across a fin-like silicon body to form a channel region.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 7A to 14A are cross-sectional views of a method of forming a semiconductor device at various stages in accordance with some embodiments taken along a line, such as the line parallel to a lengthwise direction of the gate structure in FIG. 1.

FIGS. 7B to 14B are different cross-sectional views corresponding to FIG. 7A to 14A which is taken along a line, such as line 2 in FIG. 1.

DETAILED DESCRIPTION

Figure 1:
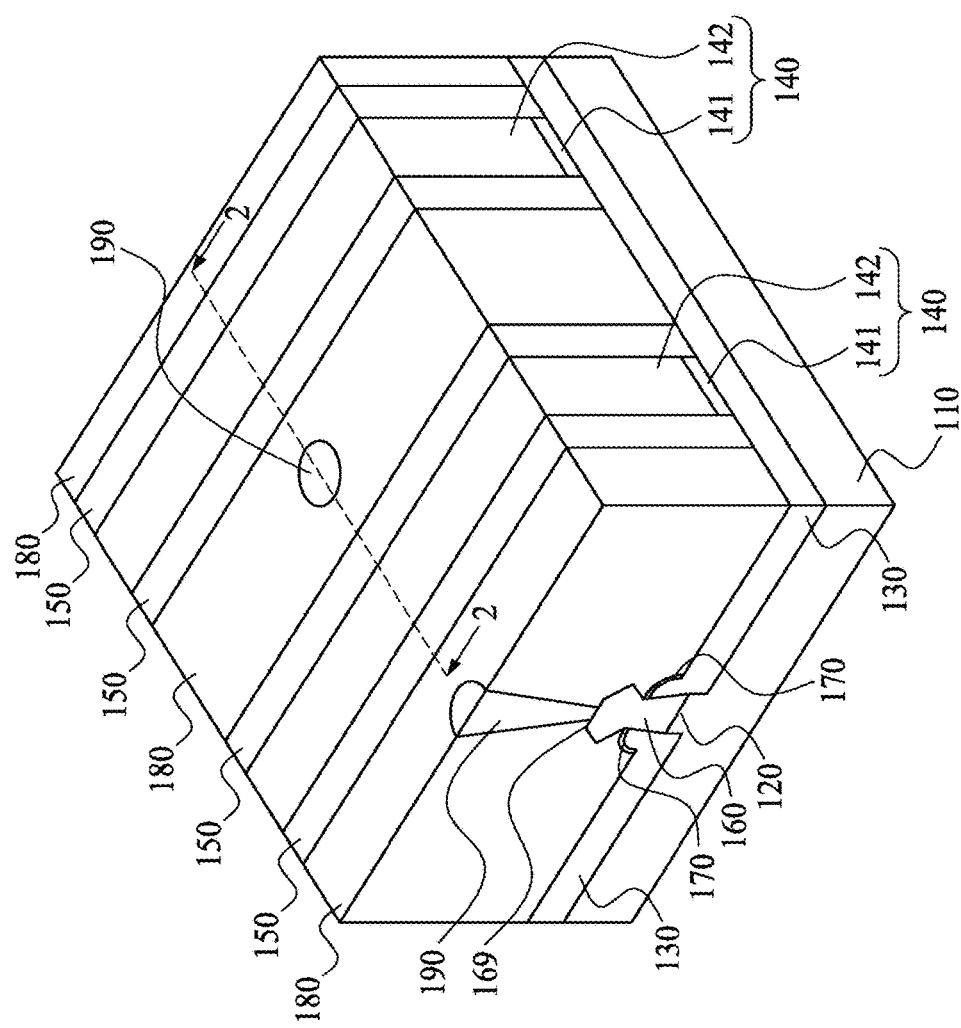
FIG. 1 is a perspective view of an exemplary semiconductor device according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the some embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A Source/drain region of a finFET may be formed on the semiconductor fin by epitaxial growth. Embodiments of the present disclosure provide some improved epitaxy source/drain regions. These embodiments are discussed below in the context of forming the semiconductor device having a single semiconductor fin or multiple fins on a bulk silicon substrate. One of ordinary skill in the art will realize that embodiments of the present disclosure may be used with other configurations.

FIG. 1 is a perspective view of an exemplary semiconductor device according to some embodiments. The semiconductor device includes a substrate 110. In some embodiments, the substrate 110 includes a bulk silicon substrate. In some embodiments, the substrate 110 may be silicon in a crystalline structure. In some other embodiments, the substrate 110 may include other elementary semiconductors, such as germanium, or include a compound semiconductor, such as silicon carbide, gallium arsenide, indium arsenide, or indium phosphide. In yet some other embodiments, the substrate 110 includes a silicon-on-insulator (SOI) substrate. The SOI substrate may be fabricated using separation by implantation of oxygen, wafer bonding, and/or other suitable methods.

A semiconductor fin 120 protrudes from the substrate 110. In some embodiments, the semiconductor fin 120 includes silicon. It is note that the number of the semiconductor fin 120 in FIG. 1 is illustrative, and should not limit the claimed scope of the present disclosure. A person having ordinary skill in the art may select suitable number for the semiconductor fin 120 according to actual situations.

The semiconductor device further includes shallow trench isolation (STI) structures 130 surrounding the semiconductor fin 120. The STI structures 130 may include any suitable insulating material, such as silicon oxide. It is understood that although one semiconductor fin 120 is illustrated, additional parallel semiconductor fins may be formed in a similar manner. In some embodiments, the STI structure 130 has a thickness ranging from, for example, about 30 nm to about 60 nm.

The semiconductor device further includes at least one gate structure 140. The gate structure 140 is formed on a portion of the semiconductor fin 120. The gate structure 140 includes a gate dielectric layer 141 and a gate electrode layer 142. The gate dielectric layer 141 is present between the gate electrode layer 144 and the substrate 110, and is formed on the semiconductor fin 120. The gate dielectric layer 141, which prevents electron depletion, may include, for example, a high-k dielectric material such as metal oxides, metal nitrides, metal silicates, transition metal-oxides, transition metal-nitrides, transition metal-silicates, oxynitrides of metals, metal aluminates, zirconium silicate, zirconium aluminate, or combinations thereof. Some embodiments may include hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), lanthanum oxide (LaO), zirconium oxide (ZrO), titanium oxide (TiO), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), silicon nitride ($Si_3N_4$), oxynitrides (SiON), and combinations thereof. The gate dielectric layer 141 may have a multilayer structure such as one layer of silicon oxide (e.g., interfacial layer) and another layer of high-k material.

The gate electrode layer 142 is formed over the substrate 110 to cover the gate dielectric layer 141 and the portion of the semiconductor fin 120 covered by the gate dielectric layer 141. In some embodiments, the gate electrode layer 142 includes a semiconductor material such as polysilicon, amorphous silicon, or the like. The gate electrode layer 142 may be deposited doped or undoped. For example, in some embodiments, the gate electrode layer 142 includes polysilicon deposited undoped by low-pressure chemical vapor deposition (LPCVD). Once applied, the polysilicon may be doped with, for example, phosphorus ions (or other n-type dopant) or boron (or other p-type dopant) based on the type of the semiconductor device. The polysilicon may also be deposited, for example, by furnace deposition of an in-situ doped polysilicon. Alternatively, the gate electrode layer 142 may include a polysilicon metal alloy or a metal gate including metals such as tungsten (W), nickel (Ni), aluminum (Al), tantalum (Ta), titanium (Ti), or any combination thereof.

The semiconductor fin 120 includes a channel region (not shown) covered and wrapped by the gate structure 140. The semiconductor fin 120 may be doped to provide a suitable channel for an n-type finFET (NMOS device) or p-type finFET (PMOS device). The semiconductor fin 120 may be doped using processes such as, ion implantation, diffusion, annealing, and/or other suitable processes.

The semiconductor device further includes at least a pair of spacers 150. The spacers 150 are respectively formed above the substrate 110 and adjacent to opposite sides of the gate structure 140. Portions of the semiconductor fin 120 are covered by the spacers 150. In some embodiments, the spacer 150 may include silicon oxide, silicon nitride, silicon oxynitride, or other suitable material. The spacer 150 may include a single layer or multilayer structure.

Figure 2:
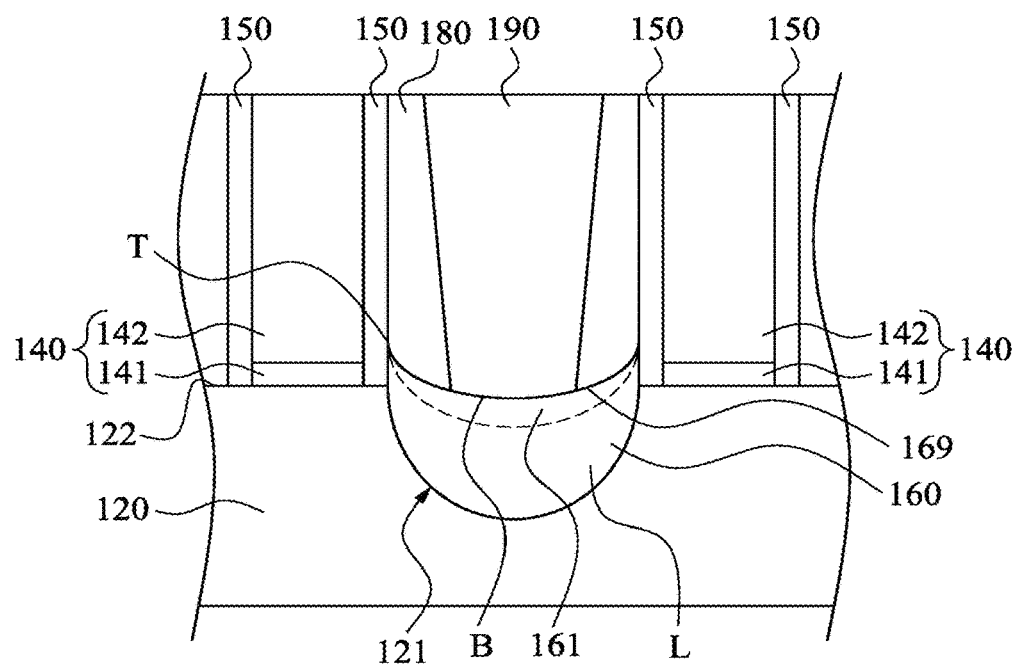
FIG. 2 is a cross-sectional view of the semiconductor device in FIG. 1 taken along line 2-2.

Reference is made to FIG. 2, which is a cross-sectional view taken along line 2 in FIG. 1. The semiconductor fin 120 includes at least one recess 121 between the spacers 150. The recess 121 is formed on the portions of the semiconductor fin 120 that are not covered by the spacers 150 and the gate structure 140. More particularly, a portion of the semiconductor fin 120 exposed both by the gate structure 140 and the spacers 150 is partially removed (or partially recessed) to form a recess 121 in semiconductor fin 120.

Figure 3:
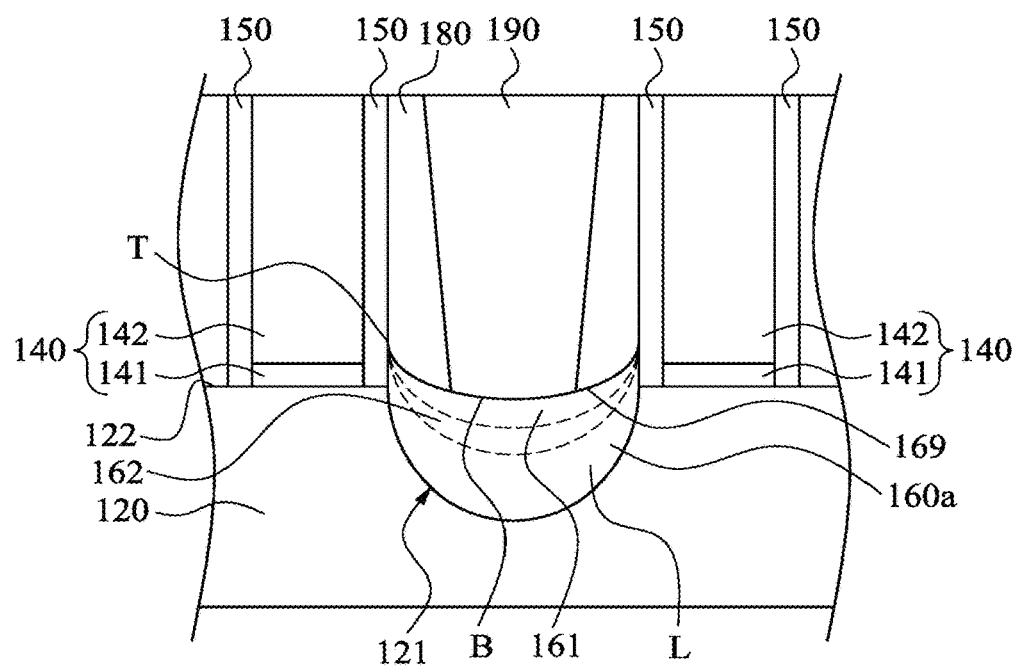
FIG. 3 is a cross-sectional view of a semiconductor device in accordance with some embodiments of the present disclosure.

The semiconductor device further includes at least one epitaxy structure 160. The epitaxy structure 160 is formed on the semiconductor fin 120. More particularly, the epitaxy structure 160 is formed in the recess 121 of the semiconductor fin 120. In some embodiments, the semiconductor fin 120 has a topmost surface 122, as shown in FIG. 3. The epitaxy structure 160 extends below the topmost surface 122 toward the substrate 110. The epitaxy structure 160 may be formed using one or more epitaxy or epitaxial (epi) processes, such that Si features, SiGe features, and/or other suitable features can be formed in a crystalline state on the semiconductor fin 120. In some embodiments, a lattice constant of the epitaxy structure 160 is different from a lattice constant of the channel of the semiconductor fin 120, so that the channel can be strained or stressed by the epitaxy structure 160 to improve carrier mobility of the semiconductor device and enhance the device performance.

As shown in FIG. 1, the semiconductor device further includes a pair of sidewalls 170 on opposite sides of the epitaxy structure 160. The sidewalls 170 may benefit shaping the profile of the epitaxy structure 160. More particularly, the epitaxial growth of the epitaxy structure 160 may be constrained by the sidewalls 170. In some embodiments, the sidewalls 170 can include single or multiple layers, and can be made of silicon nitride, silicon oxynitride, or combination thereof. In some embodiments, the sidewall 170 has a height ranging from, for example, about 10 nm to about 20 nm.

The semiconductor device further includes an interlayer dielectric (ILD) layer 180. The ILD layer 180 is formed on the substrate 110 to cover the epitaxy structure 160. The ILD layer 180 may include silicon oxide, silicon nitride, silicon oxynitride, silicon carbide, a low-dielectric constant dielectric material, or combinations thereof.

The semiconductor device further includes at least one source/drain contact 190. The source/drain contact 190 is formed through the ILD layer 180 and contacts with a top surface 169 of the epitaxy structure 160. In some embodiments, the source/drain contact 190 includes W, Co, Cu, Al or other suitable conductive material.

The epitaxy structure 160 is doped with a suitable impurity to serve as a source region or a drain region of the semiconductor device. In some embodiments, the epitaxy structure 160 is doped with an n-type impurity, such as phosphorus, and a topmost location T of the epitaxy structure 160 has a phosphorus concentration lower than a phosphorus concentration of a location L of the epitaxy structure 160 below the topmost location T, as shown in FIG. 2. In other words, phosphorus on the topmost location T is reduced. By such a phosphorus concentration distribution, a top surface 169 of the epitaxy structure 160, which is farthest away from the semiconductor fin 120, may be formed in a suitable size and shape, which may benefit formation of the source/drain contact 190 on the top surface 169. Moreover, by such a phosphorus concentration distribution, the top surface 169 can be higher than the topmost surface 122 of the semiconductor fin 120. In other words, a portion of the epitaxy structure 160 is formed in excess of the recess 121, which may benefit formation of the source/drain contact 190. In some embodiments, by controlling the phosphorus concentration, the epitaxy structure 160 has a thickness ranging from about 45 nm to about 65 nm. The vertical distance from the topmost location T to a bottommost location B of the top surface 169 ranges from about 10 nm to about 25 nm, and the ratio of this vertical distance to the thickness of the epitaxy structure 160 ranges from about 15% to about 55%. In some embodiments, the concentration of the impurity is correlated to the dose of the dopant used in the implantation process, and therefore, the dose of phosphorus is controlled or tuned to make the phosphorus concentration of the topmost location T of the epitaxy structure 160 lower than the phosphorus concentration of the lower location L of the epitaxy structure 160 below the topmost location T. The phosphorus-doped epitaxy structure 160 may serve as an n-type source/drain region. Therefore, the semiconductor device may serve as an n-type finFET.

In some embodiments, the epitaxy structure 160 includes a topmost layer 161 on which the topmost location T is located. The phosphorus concentration of the topmost layer 161 is spatially various. In other words, the phosphorus concentration of the topmost layer 161 is unevenly distributed. More particularly, the phosphorus concentration of the topmost layer 161 decreases along a direction from the substrate 110 to the semiconductor fin 120. In other words, the phosphorus concentration of the topmost layer 161 increases along a direction from the topmost layer 161 to the substrate 110. By such a phosphorus concentration distribution, a top surface 169 of the topmost layer 161 may be formed in a suitable size and shape, which may benefit formation of the source/drain contact 190 on the top surface 169. For example, a bottommost location of the topmost layer 161 may have a phosphorus concentration ranging from about 1e20 cm$^{-3}$ to about 1e22 cm$^{-3}$, and a topmost location of the topmost layer 161 (namely, the topmost location T) may have a phosphorus concentration ranging from about 2e19 cm$^{-3}$ to about 1e22 cm$^{-3}$, and the phosphorus concentration of the topmost layer 161 decreases upwardly. The dose of the phosphorus dopant used in the implantation process may be controlled or tuned to implement such a phosphorus concentration profile.

FIG. 3 is a cross-sectional view of a semiconductor device in accordance with some embodiments of the present disclosure. As shown in FIG. 3, in some embodiments, the epitaxy structure 160a further includes a first layer 162. The first layer 162 underlies the topmost layer 161. In other words, the first layer 162 is a lower layer located below the topmost layer 161. The phosphorus concentration of the topmost layer 161 is lower than a phosphorus concentration of the first layer 162. That is, any location of the first layer 162 has the phosphorus concentration higher than the maximal phosphorus concentration of the topmost layer 161. Such a phosphorus concentration may benefit the epitaxy structure 160a formed in a suitable size and shape, which may benefit formation of the source/drain contact 190 on the top surface 169. In some embodiments, the phosphorus concentration of the first layer 162 is spatially various. In other words, the phosphorus concentration of the first layer 162 is unevenly distributed. In some embodiments, a variation amount of the phosphorus concentration of the first layer 162 is lower than a variation amount of the phosphorus concentration of the topmost layer 161. In other words, compared to the topmost layer 161, the phosphorus concentration of the first layer 162 is distributed in a relatively uniform manner. In some embodiments, the phosphorus concentration of the first layer 162 ranges from about 1e20 cm$^{-3}$ to about 1e22 cm$^{-3}$. The dose of the phosphorus dopant used in the implantation process may be controlled or tuned to implement such a phosphorus concentration profile.

Figure 4:
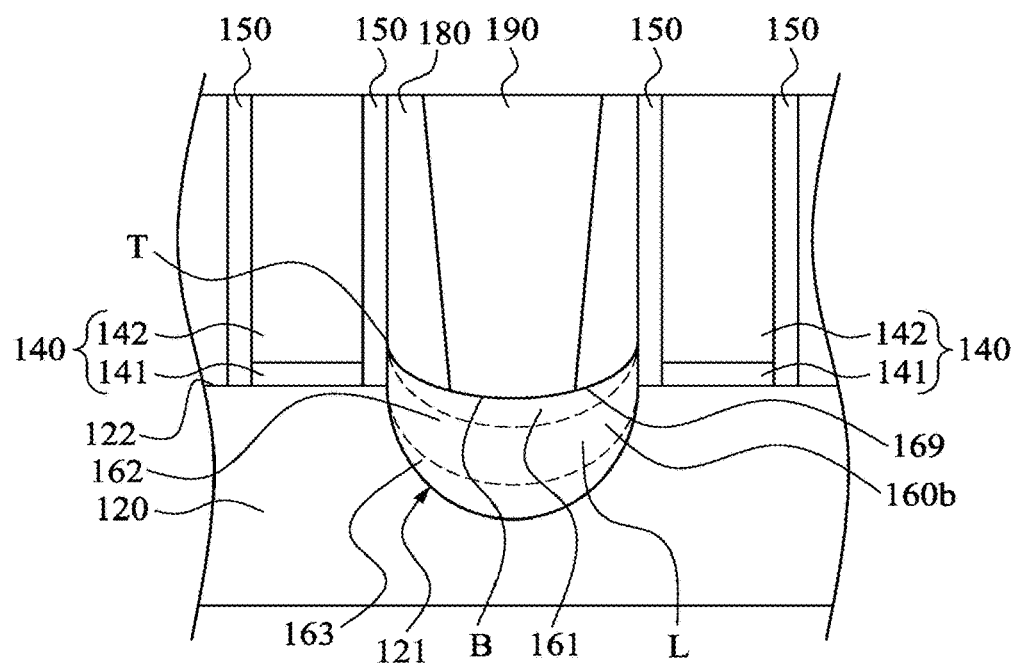
FIG. 4 is a cross-sectional view of a semiconductor device in accordance with some embodiments of the present disclosure.

FIG. 4 is a cross-sectional view of a semiconductor device in accordance with some embodiments of the present disclosure. As shown in FIG. 4, in some embodiments, the epitaxy structure 160b further includes a second layer 163. The second layer 163 underlies the first layer 162. In other words, the second layer 163 is located below the first layer 162. The phosphorus concentration of the second layer 163 is lower than the phosphorus concentration of the first layer 162. That is, any location of the second layer 163 has the phosphorus concentration not greater than the minimal phosphorus concentration of the first layer 162. Such a phosphorus concentration distribution may benefit reducing a short channel effect of the finFET. In some embodiments, the phosphorus concentration of the second layer 163 is spatially various. In other words, the phosphorus concentration of the second layer 163 is unevenly distributed. In some embodiments, the phosphorus concentration of the second layer 163 increases along a direction from the substrate 110 to the semiconductor fin 120. In other words, the phosphorus concentration of the second layer 163 increases upwardly because a higher location of the second layer 163 may induce less short channel effects. In some embodiments, a variation amount of the phosphorus concentration of the first layer 162 is lower than a variation amount of the phosphorus concentration of the second layer 163. In other words, compared to the second layer 163, the phosphorus concentration of the first layer 162 is distributed in a relatively uniform manner. In some embodiments, a bottommost location of the second layer 163 has a phosphorus concentration ranging from about 1e18 cm$^{-3}$ to about 2e19 cm$^{-3}$, and a topmost location of the second layer 163 has a phosphorus concentration ranging from about 1e20 cm$^{-3}$ to about 1e22 cm$^{31\ 3}$, and the phosphorus concentration of the second layer 163 increases upwardly. The dose of the phosphorus dopant used in the implantation process may be controlled or tuned to implement such a phosphorus concentration profile.

Figure 5:
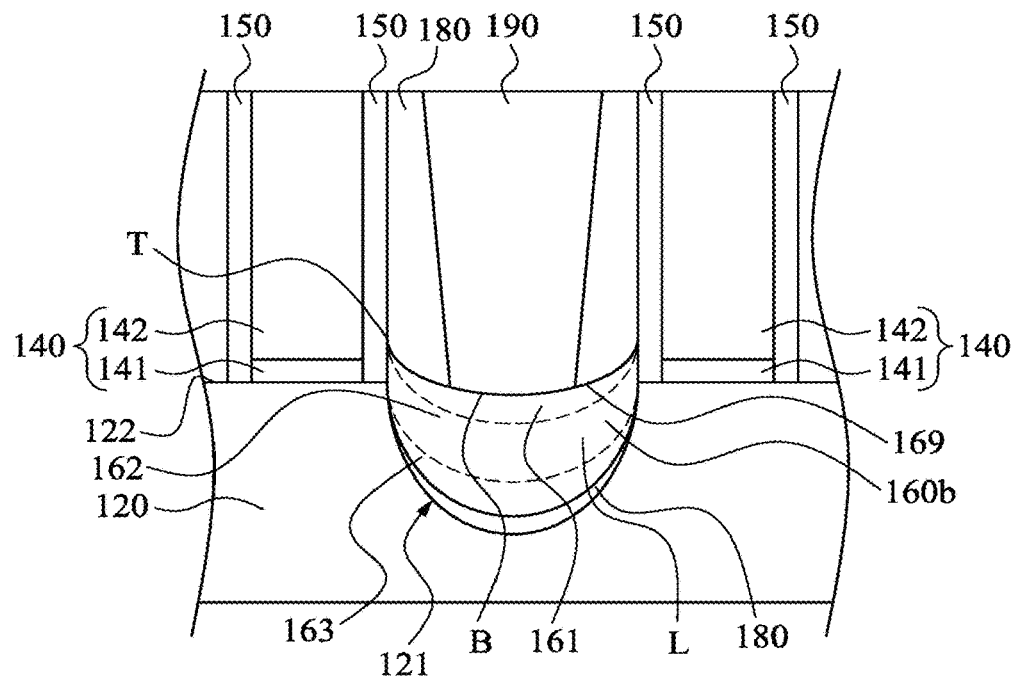
FIG. 5 is a cross-sectional view of a semiconductor device in accordance with some embodiments of the present disclosure.

FIG. 5 is a cross-sectional view of a semiconductor device in accordance with some embodiments of the present disclosure. As shown in FIG. 5, in some embodiments, the semiconductor device further includes a doped layer 180. The doped layer 180 underlies the epitaxy structure 160b. In other words, the doped layer 180 is located below the epitaxy structure 160b. The epitaxy structure 160b is conformally formed on the doped layer 180. The doped layer 180 is doped with a material different from phosphorus. For example, the doped layer 180 may be formed by doping arsenic into the semiconductor fin 120 through the surface of the recess 121. In some embodiments, the doped layer 180 may be further doped with phosphorus as well, and it has a phosphorus concentration lower than the phosphorus concentration of the topmost location T of the epitaxy structure 160b. The doped layer 180 may formed by an implantation process to form a layer having a spatially various phosphorus concentration.

Figure 6:
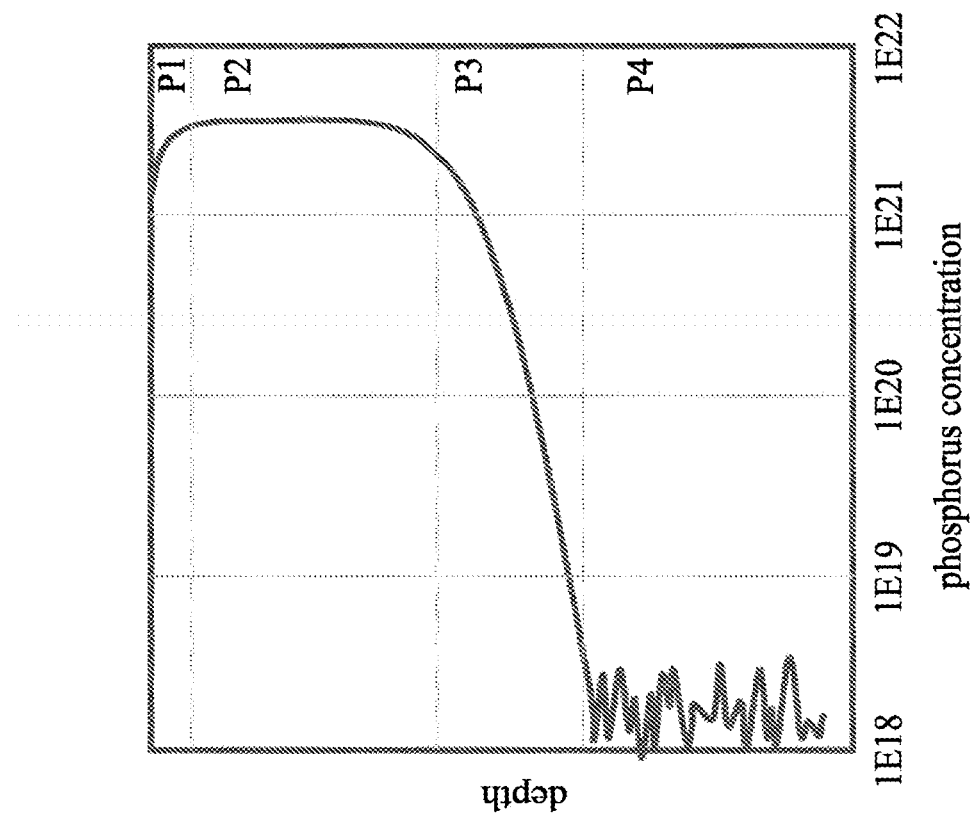
FIG. 6 is a phosphorus concentration profile in accordance with some embodiments.

FIG. 6 is a phosphorus concentration profile in accordance with some embodiments. In FIG. 6, a profile P1 is the phosphorus concentration profile of the topmost layer 161; a profile P2 is the phosphorus concentration profile of the first layer 162; a profile P3 is the phosphorus concentration profile of the second layer 163; and a profile P4 is the phosphorus concentration profile of the doped layer 180. By such an epitaxy structure 160b and a doped layer 180 having such phosphorus concentration profiles P1-P4, the top surface of the epitaxy structure can be formed in a suitable size and shape, which may benefit formation of the source/drain contact 190 thereon. The dose of the phosphorus dopant used in the implantation process may be controlled or tuned to implement the phosphorus concentration profiles P1 to P4.

FIGS. 7A to 14A are cross-sectional views of a method of forming a semiconductor device at various stages in accordance with some embodiments taken along a line, such as the line parallel to a lengthwise direction of the gate structure 140 in FIG. 1. FIGS. 7B to 14B are different cross-sectional views corresponding to FIG. 7A to 14A which is taken along a line, such as line 2 in FIG. 1.

Reference is made to FIGS. 7A and 7B. A semiconductor fin 220 is formed on the substrate 210 and protrudes from the substrate 210. The semiconductor fin 220 may be formed by, for example, patterning and etching the substrate 210 using photolithography techniques. In some embodiments, a layer of photoresist material (not shown) is deposited over the substrate 210. The layer of photoresist material is irradiated (exposed) in accordance with a desired pattern (the semiconductor fin 220 in this case) and developed to remove a portion of the photoresist material. The remaining photoresist material protects the underlying material from subsequent processing steps, such as etching. It should be noted that other masks, such as an oxide or silicon nitride mask, may also be used in the etching process.

In FIGS. 7A and 7B, a plurality of STI structures 230 are formed on the substrate 210. The isolation structures 230 may be formed by chemical vapor deposition (CVD) techniques using tetra-ethyl-ortho-silicate (TEOS) and oxygen as a precursor. In some other embodiments, the isolation structures 230 may be formed by implanting ions, such as oxygen, nitrogen, carbon, or the like, into the substrate 210.

Figure 8B:
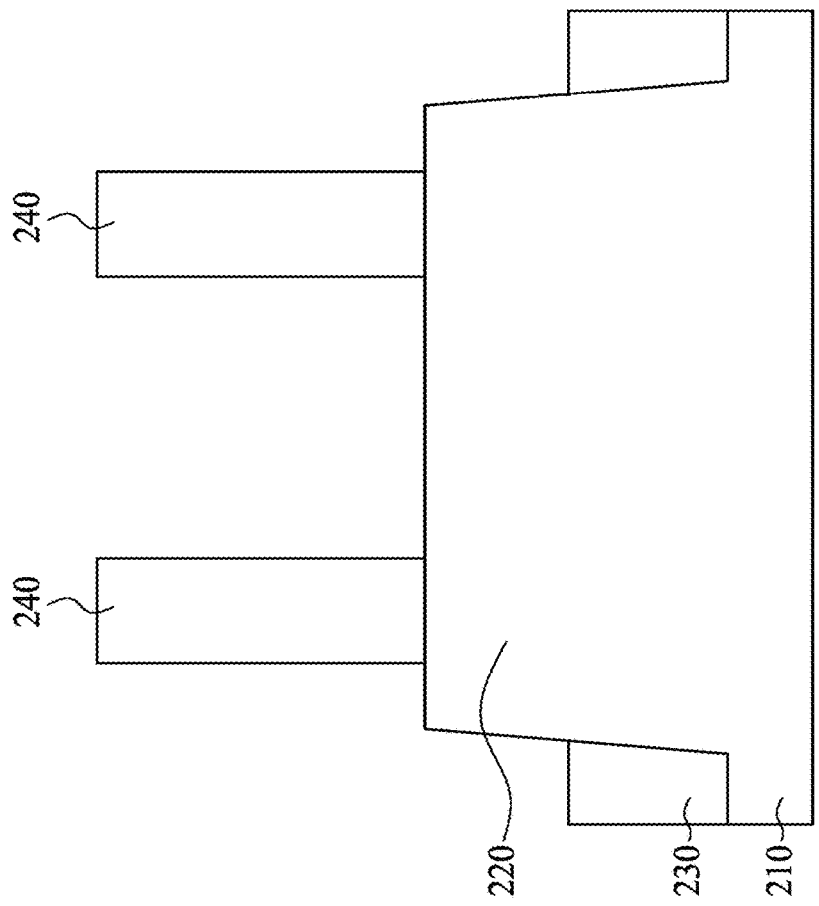
Figure 8A:
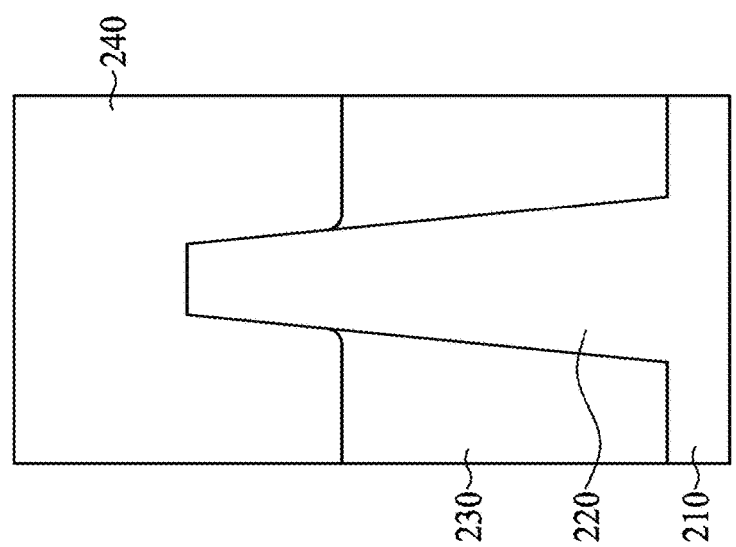

Reference is made to FIGS. 8A and 8B. Dummy gate structures 240 are formed on portions of the semiconductor fin 220 at an interval and expose another portion of the semiconductor fin 220. The dummy gate structures 240 include polysilicon, and they can be formed by a deposition process, such as a CVD process.

Reference is made to FIGS. 9A and 9B. A dielectric layer 250 is conformally formed over the semiconductor fin 220 and the dummy gate structures 240. In some embodiments, the dielectric layer 250 may include silicon oxide, silicon nitride, silicon oxy-nitride, or other suitable material. The dielectric layer 250 may include a single layer or multilayer structure. The dielectric layer 250 may be formed by a deposition process, such as an atomic layer deposition (ALD) process, a CVD process, a PVD process or a sputter deposition process or other suitable techniques.

Figure 10B:
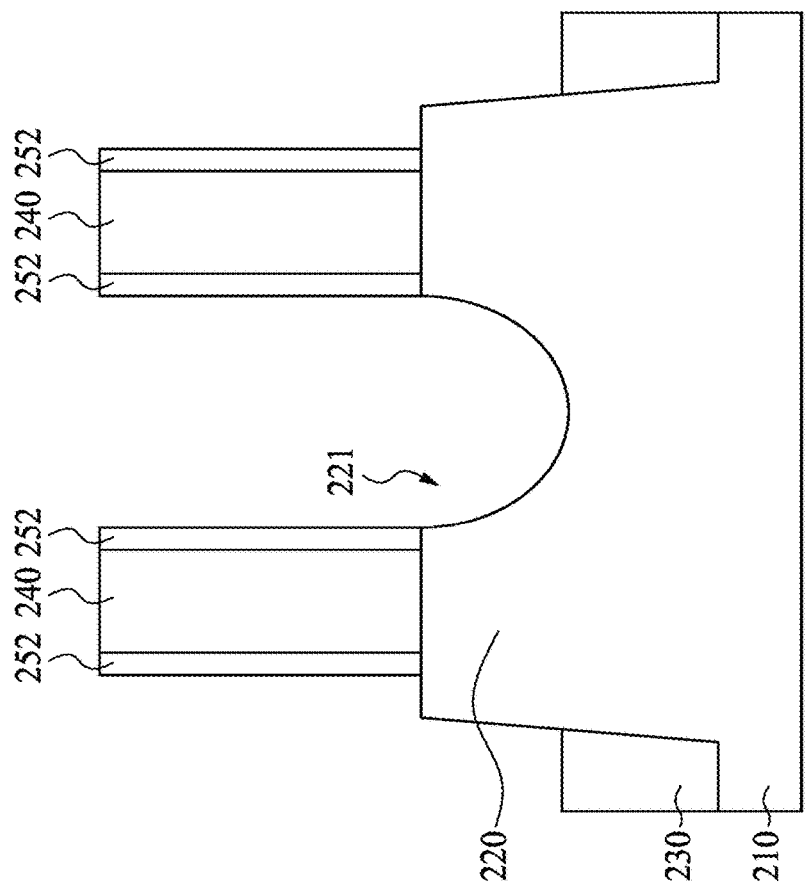
Figure 10A:
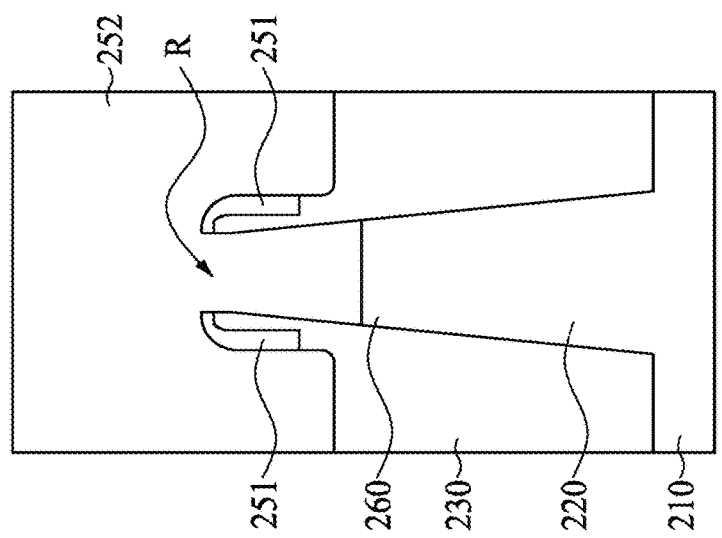

Reference is made to FIGS. 10A and 10B. A removal process is performed to remove a portion of the dielectric layer 250 and a portion of the underlying semiconductor fin 220, so that a portion of the semiconductor fin 220 is exposed, and some remaining portions of the dielectric layer 250 serve as a pair of sidewalls 251, which defines a recess R therebetween and on the exposed portion of the semiconductor fin 220, as shown in FIG. 10A. The removal process also forms a recess 221 on the semiconductor fin 220, as shown FIG. 10B. Some remaining portions of the dielectric layer 250 serve as a pair of spacers 252 located on two opposite sides of the dummy gate structure 240, as shown in FIG. 10B. In some embodiments, the spacers 252 may be used to offset subsequently formed epitaxy structure formed in the recess 221. The spacers 252 may further be used for designing or modifying the profile of the subsequently formed epitaxy structure.

The removal process may be a dry etching process, a wet etching process, or combination dry and wet etching process. Removal may include a lithography process to facilitate the etching process. The lithography process may include photoresist coating (e.g., spin-on coating), soft baking, mask aligning, exposure, post-exposure baking, developing the photoresist, rinsing, drying (e.g., hard baking), other suitable processes, or combinations thereof. Alternatively, the lithography process is implemented or replaced by other methods, such as maskless photolithography, electron-beam writing, and ion-beam writing. In yet some other embodiments, the lithography process could implement nanoimprint technology. In some embodiments, a pre-cleaning process may be performed to clean the recess 221 with HF or other suitable solution, which benefit subsequent epitaxy growth.

Figure 11B:
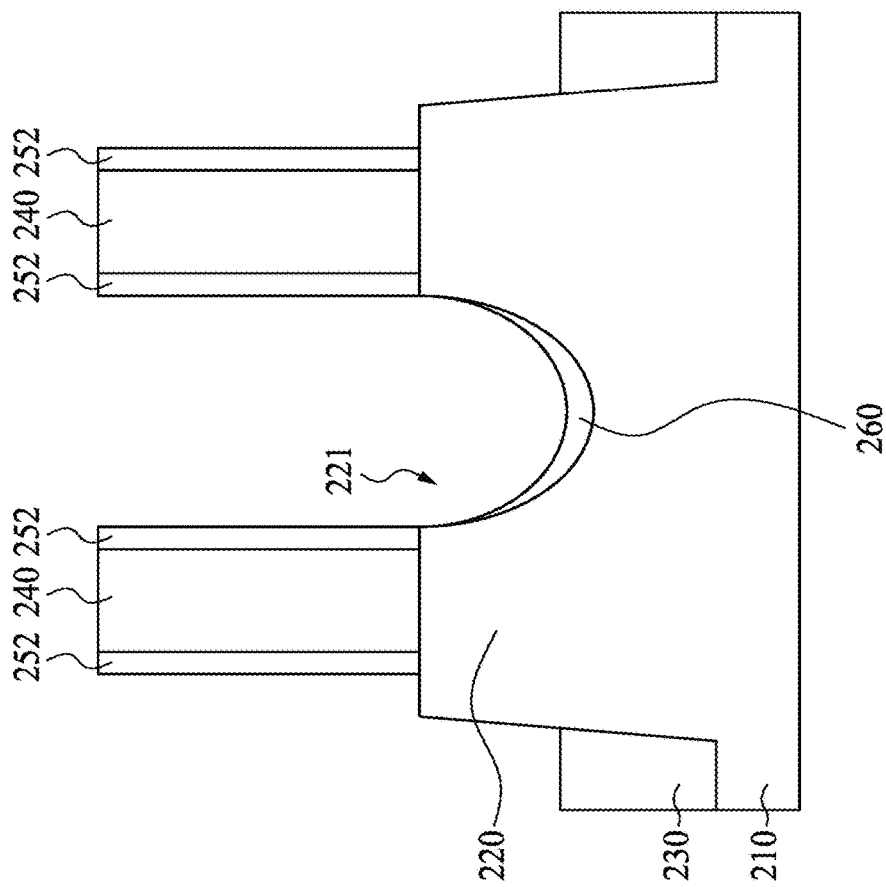
Figure 11A:
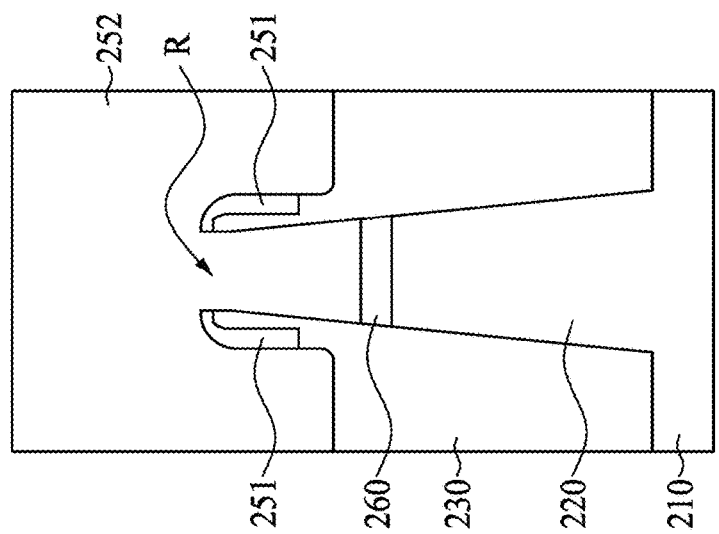

Reference is made to FIG. 11A and 11B. A doped layer 260 may be formed in the recess R between the sidewalls 251 and in the recess 221 of the semiconductor fin 220. The doped layer 260 is doped with a material different from phosphorus. For example, the doped layer 260 may be formed by doping arsenic into the semiconductor fin 220 through the exposed surface of the recess 221. The doped layer 260 may be formed by an in-situ doping process. The doping process may include an implantation process to implant dopant, such as arsenic dopant, into the semiconductor fin 220 through the exposed surface. In some embodiments, another doping process may be performed to dope phosphorus dopant into the semiconductor fin 220 through the exposed surface. In other words, the doped layer 260 may be doped with arsenic and phosphorus.

Reference is made to FIG. 12A and 12B. An epitaxy structure 270 is formed in the recess 221 of the semiconductor fin 220 and over the doped layer 260. The epitaxy structure 270 may be formed using one or more epitaxy or epitaxial (epi) processes, such that Si features can be formed in a crystalline state on the semiconductor fin 220. In some embodiments, the epitaxy process of forming the epitaxy structure 270 includes CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the semiconductor fin 220 (e.g., silicon).

A doping process is performed to dope suitable dopant into the epitaxy structure 270 to serve as a source region or a drain region of the semiconductor device. For example, the epitaxy structure 270 may be in-situ doped. The doping species include p-type dopant, such as boron or $BF_2$; n-type dopant, such as phosphorus or arsenic; and/or other suitable dopant including combinations thereof. If the epitaxy structure 270 is not in-situ doped, a second implantation process (i.e., a junction implant process) is performed to dope the epitaxy structure 270. The implantation may be performed to implant dopant into the epitaxy structure 270. One or more annealing processes may be performed to activate the epitaxy structure 270. The annealing processes include rapid thermal annealing (RTA) and/or laser annealing processes.

In some embodiments, a doping process is performed to dope phosphorus dopant into the epitaxy structure 270, and a topmost location of the epitaxy structure 270 has a phosphorus concentration lower than a phosphorus concentration of a location of the epitaxy structure 270 below the topmost location. In other words, phosphorus on the topmost location of the epitaxy structure 270 is reduced. By such a phosphorus concentration profile, a top surface 271 of the epitaxy structure 270 may be formed in a suitable size and shape, which may benefit a source/drain contact formed on the top surface 271 in a subsequent process. This phosphorus concentration distribution can be achieved by controlled the dose of the phosphorus dopant. In some embodiments, the epitxaxy structure 270 may be formed as the foregoing epitaxy structures 160, 160a, 160b or 160c by controlling the phosphorus concentration profiles of different layers.

Figure 13B:
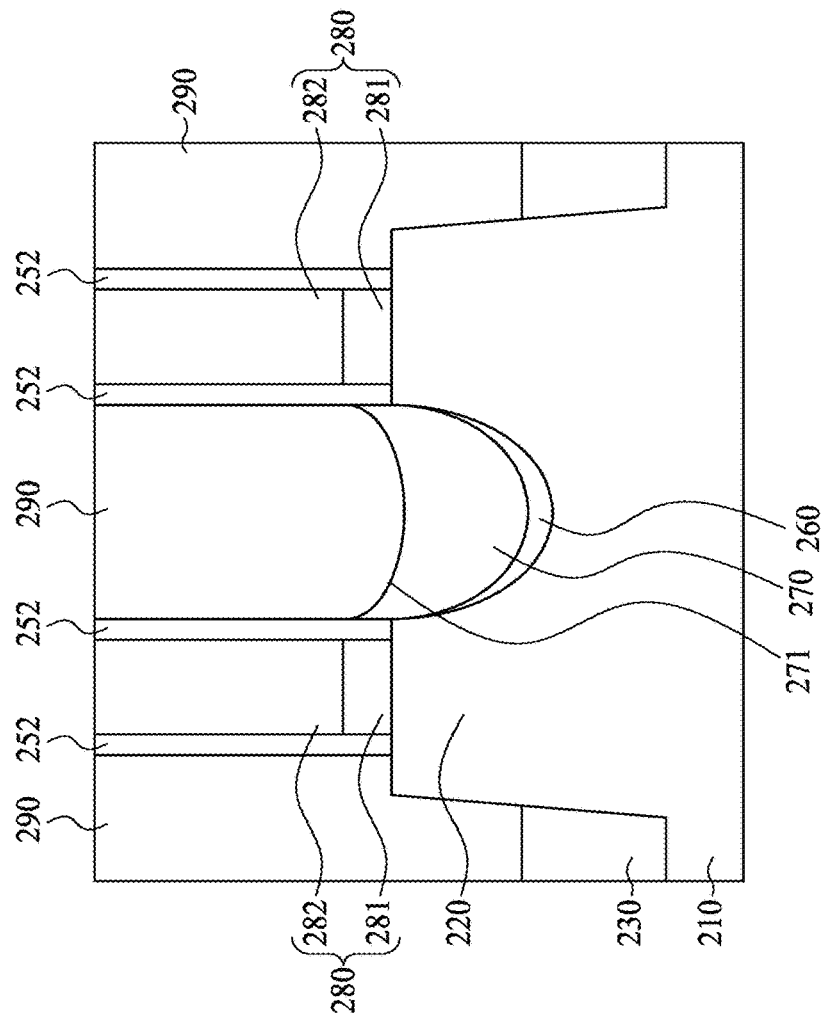
Figure 13A:
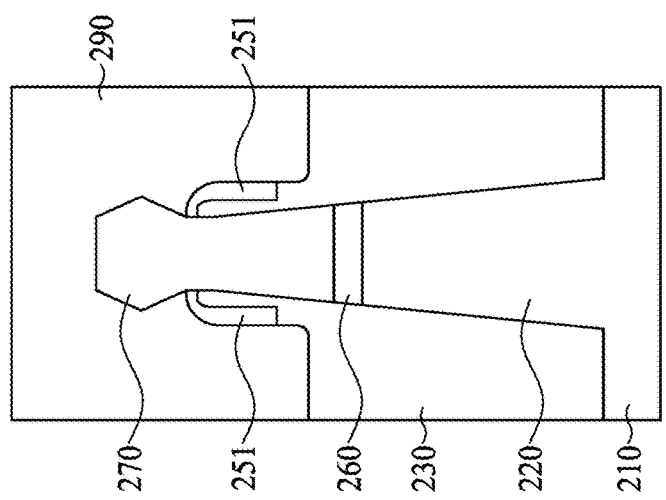

Reference is made to FIG. 13A and 13B. A gate last process (or replacement gate process) is performed to replace the dummy gate structures 240 by the gate structures 280. The gate structures 280 may include a gate dielectric layer 281 and a gate electrode layer 282. The gate electrode layer 282 may include a work function metal. Providing the gate structures 280 later in the process can avoid problems of the stability of the work function metal during formation of the source/drain epitaxy structure 270. The gate last process may include removing the dummy gate structures 240 by an etching process, forming the gate dielectric layer 281 by a deposition process, forming a gate electrode layer 282 by a deposition process, forming a dielectric capping layer on the gate electrode layer 282 by a deposition process, and removing undesired portions of the dielectric capping layer by a CMP process.

Before removing the dummy gate structures 240, an interlayer dielectric (ILD) layer 290 may be formed on the epitaxy structure 270. The ILD layer 290 includes silicon oxide, silicon nitride, silicon oxynitride, silicon carbide, low-dielectric constant dielectric material or a combination thereof. The ILD layer 290 can be formed by a deposition process, such as a CVD process.

Figures 14A, 14B:
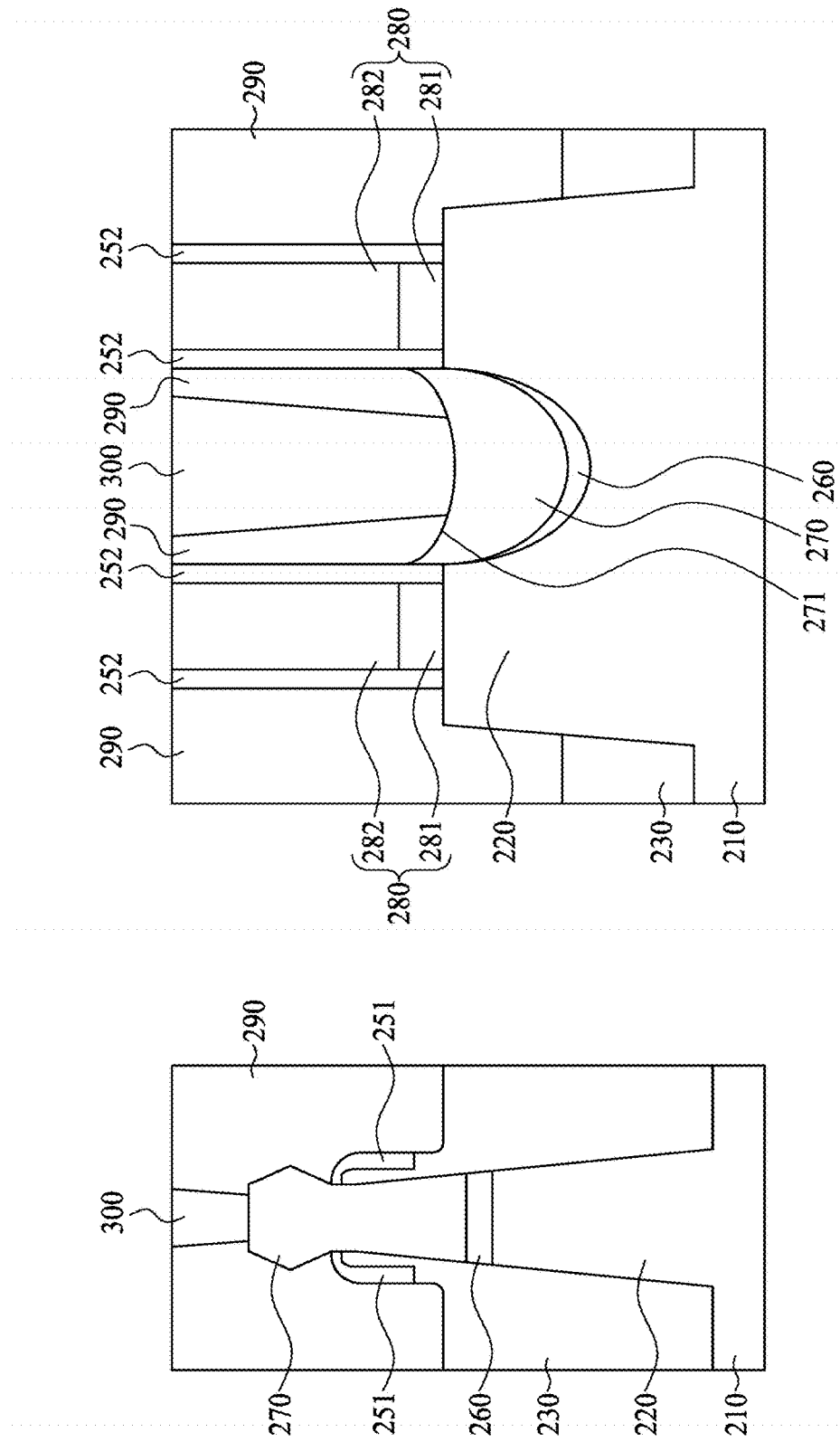

Reference is made to FIGS. 14A and 14B. A source/drain contact 300 is formed through the ILD layer 290 and contacts with the top surface 271 the epitaxy structure 270. Formation of the source/drain contact 300 may include forming a contact hole by an etching process to etch through the ILD layer 290 down to the epitaxy structure 270 and depositing metal in the contact hole by a deposition process, such as a CVD process, to form the source/drain contact 300.

In some embodiments, since the n-type impurity concentration profile makes the top surface of the epitaxy structure formed in a suitable size and shape, the source/drain contact can be formed on the top surface more easily, and the contact resistance can be reduced as well.

According to some embodiments, a semiconductor device includes a substrate, at least one semiconductor fin, and at least one epitaxy structure. The semiconductor fin is present on the substrate. The semiconductor fin has at least one recess thereon. The epitaxy structure is present in the recess of the semiconductor fin. A topmost location of the epitaxy structure has an n-type impurity concentration lower than an n-type impurity concentration of a location of the epitaxy structure below the topmost location.

According to some embodiments, a semiconductor device includes a substrate, at least one semiconductor fin, and at least one epitaxy structure. The semiconductor fin is present on the substrate and has at least one recess thereon. The epitaxy structure is present in the recess of the semiconductor fin. The epitaxy structure includes a topmost layer and a lower layer below the topmost layer. An n-type impurity concentration of the topmost layer is lower than an n-type impurity concentration of the lower layer.

According to some embodiments, a method of forming a semiconductor device includes forming at least one semiconductor fin on a substrate, removing at least one portion of the semiconductor fin to form at least one recess, and forming at least one epitaxy structure in the recess of the semiconductor fin, wherein a topmost location of the epitaxy structure has an n-type impurity concentration lower than an n-type impurity concentration of a location of the epitaxy structure below the topmost location.

One general aspect of embodiments disclosed herein includes a semiconductor device, including: a semiconductor fin extending from a substrate; a recess formed in the semiconductor fin; and an epitaxial structure filling the recess, the epitaxial structure being doped with a first dopant and having a topmost surface extending above a topmost surface of the fin, where a dopant concentration of first dopant in the epitaxial structure increases from the topmost surface to a location below the topmost surface.

Another general aspect of embodiments disclosed herein includes a semiconductor device, including: a fin having a first lattice constant; and an epitaxial source/drain region formed in the fin, the epitaxial source/drain having a second lattice constant different than the first lattice constant, where a dopant concentration in the epitaxial source/drain region is lower at a topmost surface of the epitaxial source/drain region relative to a lower portion of the epitaxial source/drain region.

Another general aspect of embodiments disclosed herein includes a method, including: forming a fin structure extending from a substrate; removing a portion of the fin structure to form a recess therein; epitaxially growing an epitaxial structure in the recess; and doping the epitaxial structure so that a dopant concentration in the epitaxial structure increases from the top of the epitaxial structure to a lower region of the epitaxial structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a semiconductor fin extending from a substrate;
a recess formed in the semiconductor fin; and
an epitaxial structure filling the recess, the epitaxial structure being doped with a first dopant and having a topmost surface extending above a topmost surface of the semiconductor fin, wherein a dopant concentration of the first dopant in the epitaxial structure increases from the topmost surface to a location below the topmost surface.

2. The semiconductor device of claim 1, wherein the first dopant is n-type dopant.

3. The semiconductor device of claim 1, wherein the recess is defined between dielectric spacers on respective sides of the recess.

4. The semiconductor device of claim 1, wherein the epitaxial structure includes two or more epitaxial layers.

5. The semiconductor device of claim 4, wherein the two or more epitaxial layers includes a topmost layer and an underlying layer between the topmost layer and the substrate, and wherein the dopant concentration in the topmost layer increases from the topmost surface to an interface between the topmost layer and the underlying layer.

6. The semiconductor device of claim 5, wherein the topmost layer has a first amount of variation in the dopant concentration and the underlying layer has a second amount of variation in dopant concentration and the second amount is less than the first amount.

7. The semiconductor device of claim 4, wherein the two or more epitaxial layers includes a topmost layer, an underlying layer between the topmost layer and the substrate, and a bottom layer between the underlying layer and the substrate, and wherein the bottom layer has a dopant concentration less than a dopant concentration of the underlying layer.

8. The semiconductor device of claim 1, further comprising a doped layer lining the recess, the doped layer being doped with a second dopant different than the first dopant.

9. A semiconductor device, comprising:
a fin having a first lattice constant; and an epitaxial source/drain region formed in the fin, the epitaxial source/drain region having a second lattice constant different than the first lattice constant, wherein a dopant concentration in the epitaxial source/drain region is lower at a topmost surface of the epitaxial source/drain region relative to a lower portion of the epitaxial source/drain region.

10. The semiconductor device of claim 9, wherein the dopant concentration in the epitaxial source/drain region is lower at a bottommost surface of the epitaxial source/drain region relative to the lower portion of the epitaxial source/drain region.

11. The semiconductor device of claim 9, further comprising a doped layer in the fin, the doped layer lining a lower part of the epitaxial source/drain region, the doped layer being doped with a dopant that is different than the dopant in the epitaxial source/drain region.

12. The semiconductor device of claim 11, wherein the dopant in the epitaxial source/drain region is phosphorous and the dopant in the doped layer is arsenic.

13. The semiconductor device of claim 11, wherein an upper surface of the doped layer is below an upper surface of the lower portion.

14. The semiconductor device of claim 9, wherein the topmost surface of the epitaxial source/drain region extends above a topmost surface of the fin.

15. The semiconductor device of claim 9, wherein the epitaxial source/drain region comprises a topmost layer and an underlying layer and wherein a variation amount of the dopant concentration in the topmost layer is higher than a variation amount of the dopant concentration in the underlying layer.

16. The semiconductor device of claim 15, wherein a ratio of a height of the topmost layer to a height of the epitaxial source/drain region is from about 15% to about 55%.

17. A method, comprising:
  forming a fin structure extending from a substrate;
  removing a portion of the fin structure to form a recess therein;
  epitaxially growing an epitaxial structure in the recess; and
  doping the epitaxial structure so that a dopant concentration in the epitaxial structure increases from a top region of the epitaxial structure to a lower region of the epitaxial structure.

18. The method of claim 17, wherein epitaxially growing an epitaxial structure comprises epitaxially growing two or more epitaxial layers, respective epitaxial layers having different dopant concentration profiles.

19. The method of claim 17, further comprising doping sidewalls of the recess with a first dopant and doping the epitaxial structure with a second dopant different than the first dopant.

20. The method of claim 17, wherein doping the epitaxial structure comprises doping the epitaxial structure in situ during the epitaxially growing process.

* * * * *